United States Patent
Uesaka (10) Patent No.: US 12,261,582 B2
(45) Date of Patent: Mar. 25, 2025

(54) ACOUSTIC WAVE DEVICE

(71) Applicant: Murata Manufacturing Co., Ltd., Nagaokakyo (JP)

(72) Inventor: Kenichi Uesaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 517 days.

(21) Appl. No.: 17/542,803

(22) Filed: Dec. 6, 2021

(65) Prior Publication Data
US 2022/0094325 A1   Mar. 24, 2022

Related U.S. Application Data

(63) Continuation of application No. PCT/JP2020/017220, filed on Apr. 21, 2020.

(30) Foreign Application Priority Data

Jun. 14, 2019 (JP) .................... 2019-111289

(51) Int. Cl.
H03H 9/02   (2006.01)
H03H 9/56   (2006.01)

(52) U.S. Cl.
CPC .... H03H 9/02228 (2013.01); H03H 9/02015 (2013.01); H03H 9/02157 (2013.01); H03H 9/568 (2013.01)

(58) Field of Classification Search
CPC .......... H03H 9/02228; H03H 9/02015; H03H 9/02157; H03H 9/568
See application file for complete search history.

(56) References Cited

U.S. PATENT DOCUMENTS

| | | | | |
|---|---|---|---|---|
| 11,683,019 B2* | 6/2023 | Matsuoka | .......... | H03H 9/02535 |
| | | | | 310/313 R |
| 2012/0313483 A1* | 12/2012 | Matsuda | .............. | H03H 9/6483 |
| | | | | 310/313 C |
| 2013/0249647 A1 | 9/2013 | Nakanishi et al. | | |
| 2016/0065176 A1 | 3/2016 | Taniguchi et al. | | |

(Continued)

FOREIGN PATENT DOCUMENTS

| | | | |
|---|---|---|---|
| JP | 2013-544041 A | 12/2013 | |
| JP | 2019-080093 A | 5/2019 | |

(Continued)

OTHER PUBLICATIONS

Official Communication issued in International Patent Application No. PCT/JP2020/017220, mailed on Jul. 14, 2020.

*Primary Examiner* — Samuel S Outten
(74) *Attorney, Agent, or Firm* — Keating & Bennett, LLP (57) ABSTRACT

An acoustic wave device includes a dielectric film covering an IDT electrode. The IDT electrode includes first and second edge regions and first and second high acoustic velocity regions. The first and second edge regions are low acoustic velocity regions. The first and second high acoustic velocity regions are on outer sides of an intersecting width region where first and second electrode fingers are adjacent to each other in an acoustic wave propagation direction. A thickness of the dielectric film on the first and second edge regions is greater than that of the dielectric film on the first and second high acoustic velocity regions.

14 Claims, 5 Drawing Sheets

(56) References Cited

U.S. PATENT DOCUMENTS

| | | | |
|---|---|---|---|
| 2016/0072475 A1* | 3/2016 | Mimura | H03H 9/02992 |
| | | | 333/195 |
| 2017/0279433 A1* | 9/2017 | Matsukura | H03H 3/04 |
| 2019/0123713 A1 | 4/2019 | Daimon | |
| 2020/0204154 A1 | 6/2020 | Daimon | |

FOREIGN PATENT DOCUMENTS

| | | | |
|---|---|---|---|
| WO | 2014/192755 A1 | 12/2014 | |
| WO | 2019/049893 A1 | 3/2019 | |

* cited by examiner

ACOUSTIC WAVE DEVICE

CROSS REFERENCE TO RELATED APPLICATIONS

This application claims the benefit of priority to Japanese Patent Application No. 2019-111289 filed on Jun. 14, 2019 and is a Continuation Application of PCT Application No. PCT/JP2020/017220 filed on Apr. 21, 2020. The entire contents of each application are hereby incorporated herein by reference.

BACKGROUND OF THE INVENTION

1. Field of the Invention

The present invention relates to an acoustic wave device including an IDT electrode with a low acoustic velocity region where an acoustic velocity is lower than that in a central region.

2. Description of the Related Art

Acoustic wave devices utilizing a piston mode have been known. For example, the acoustic wave device disclosed in International Publication No. 2014/192755 has a portion in which first electrode fingers connected to one potential and second electrode fingers connected to the other potential overlap in an acoustic wave propagation direction. This overlap portion is an intersecting width region including a central region located at a center in a direction in which the first and second electrode fingers extend, a first low acoustic velocity region located on one outer side of the central region, and a second low acoustic velocity region located on the other outer side of the central region. An acoustic velocity in the first and second low acoustic velocity regions is lower than that in the central region. In the direction in which the first and second electrode fingers extend, a first high acoustic velocity region is provided on the outer side of the first low acoustic velocity region and a second high acoustic velocity region is provided on the outer side of the second low acoustic velocity region. Such an acoustic velocity relationship provides a piston mode.

In the first and second low acoustic velocity regions, an electrode finger width, which is the dimension of electrode fingers in the acoustic wave propagation direction, is set to be larger than an electrode finger width in the central region. This results in a reduction in an acoustic velocity.

In the first and second low acoustic velocity regions, the width of the first and second electrode fingers is set to be large. Accordingly, in the first and second low acoustic velocity regions, the gap between the first electrode finger and the second electrode finger is narrow. There is a problem that a surge breakdown easily occurs in this portion.

SUMMARY OF THE INVENTION

Preferred embodiments of the present invention provide acoustic wave devices in each of which a surge breakdown is less likely to occur.

An acoustic wave device according to a preferred embodiment of the present invention includes a piezoelectric substrate, an IDT electrode on the piezoelectric substrate, and a dielectric film covering the IDT electrode. The IDT electrode includes a first busbar, a second busbar facing the first busbar, a plurality of first electrode fingers including respective first ends connected to the first busbar, and a plurality of second electrode fingers including respective first ends connected to the second busbar. The first electrode fingers and the second electrode fingers interdigitate with each other. When a region where the first electrode fingers and the second electrode fingers overlap in an acoustic wave propagation direction is defined as an intersecting width region, the intersecting width region includes a central region located at a center in a direction in which the first electrode fingers and the second electrode fingers extend, a first edge region located on one outer side of the central region in the direction in which the first electrode fingers and the second electrode fingers extend, and a second edge region located on the other outer side of the central region in the direction in which the first electrode fingers and the second electrode fingers extend. In the first edge region and the second edge region, each of the first electrode fingers and the second electrode fingers has a larger width than a width in the central region. A first high acoustic velocity region is on an outer side of the first edge region in the direction in which the first electrode fingers and the second electrode fingers extend, and a second high acoustic velocity region is on an outer side of the second edge region in the direction in which the first electrode fingers and the second electrode fingers extend. A thickness of the dielectric film on the first edge region and the second edge region is greater than a thickness of the dielectric film on the first high acoustic velocity region and the second high acoustic velocity region.

In acoustic wave devices according to preferred embodiments of the present invention, a surge breakdown is less likely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below through the description of preferred embodiments of the present invention with reference to the accompanying drawings.

The preferred embodiments described in this specification are merely illustrative and the configurations to be described below may be partially replaced or combined between the different preferred embodiments.

Figure 1:
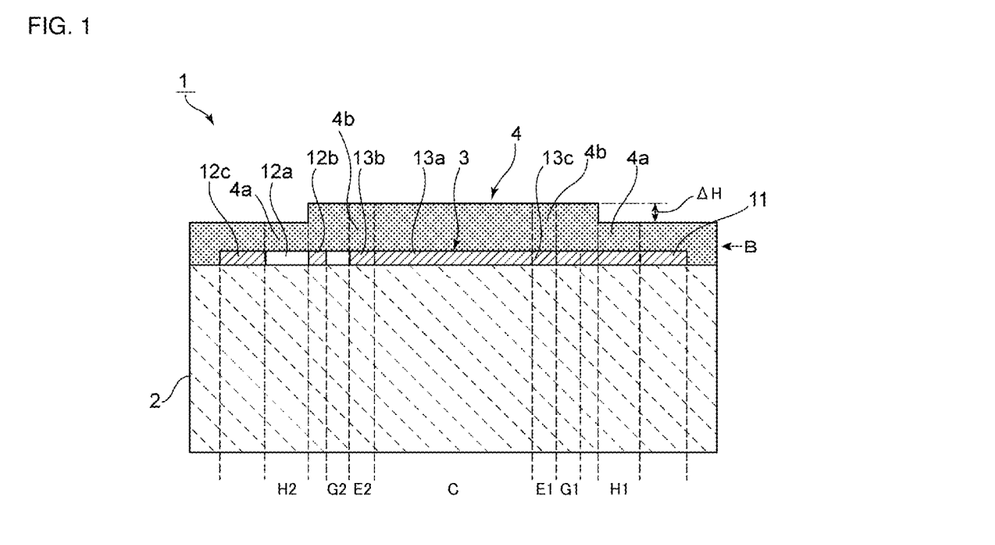
FIG. 1 is a cross-sectional side view of an acoustic wave device according to a first preferred embodiment of the present invention.
Figure 2A:
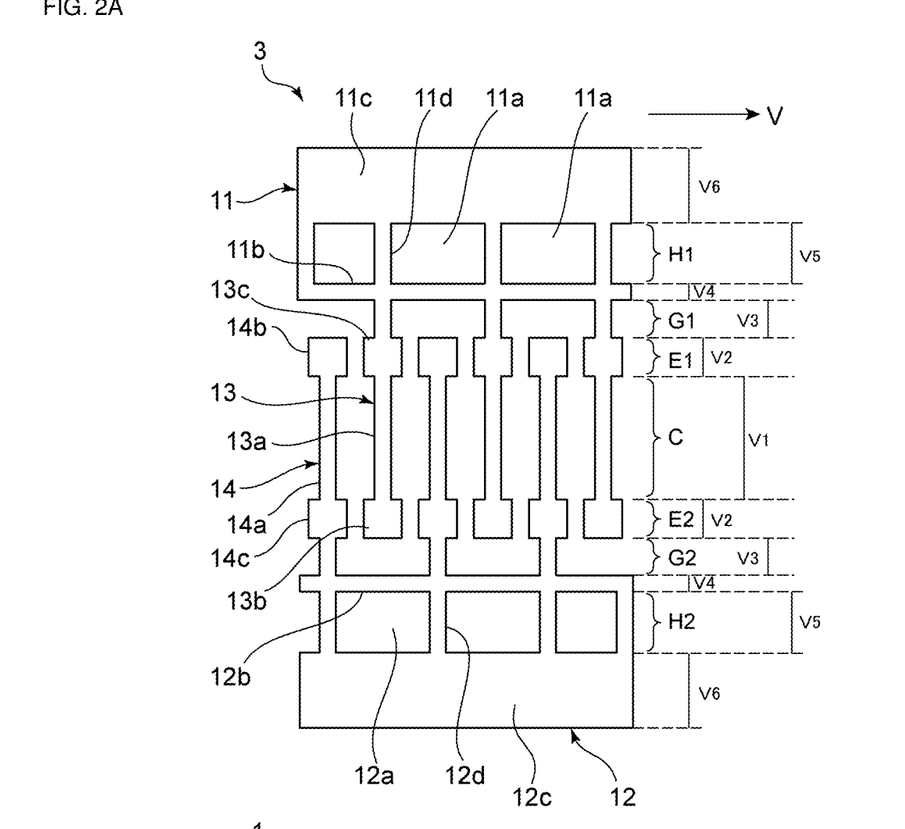
FIG. 2A is a plan view of an IDT electrode in an acoustic wave device according to the first preferred embodiment of the present invention.
Figure 2B:
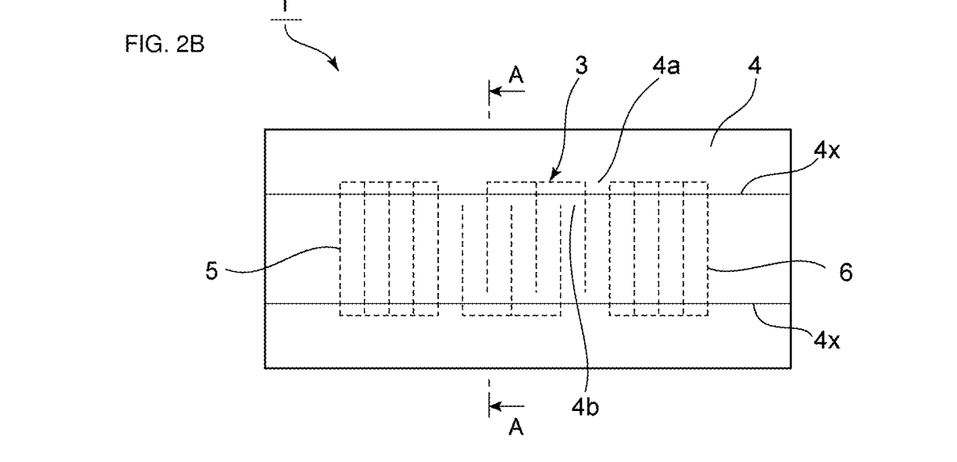
FIG. 2B is a schematic plan view of the acoustic wave device according to the first preferred embodiment of the present invention.

FIG. 1 is a cross-sectional side view of an acoustic wave device according to a first preferred embodiment of the present invention (taken along line A-A in FIG. 2B). FIG. 2A is a plan view of an IDT electrode in an acoustic wave device according to the first preferred embodiment of the present invention, and FIG. 2B is a schematic plan view of the acoustic wave device according to the first preferred embodiment of the present invention.

An acoustic wave device 1 includes a piezoelectric substrate 2. The piezoelectric substrate 2 is made of, for example, a $LiNbO_3$ single crystal in this preferred embodiment, but may be made of another piezoelectric single crystal such as $LiTaO_3$, for example.

An IDT electrode 3 is provided on the piezoelectric substrate 2. A dielectric film 4 covers the IDT electrode 3.

As illustrated in FIG. 2B, a reflector 5 is provided on one side of the IDT electrode 3 in an acoustic wave propagation direction and a reflector 6 is provided on the other side of the IDT electrode 3 in the acoustic wave propagation direction. Accordingly, a one-port acoustic wave resonator is defined in the acoustic wave device 1.

The details of the IDT electrode 3 are as illustrated in FIG. 2A. The IDT electrode 3 includes a first busbar 11 and a second busbar 12. The first busbar 11 and the second busbar 12 extend in an acoustic wave propagation direction. The first busbar 11 and the second busbar 12 are spaced apart from each other to face each other in a direction perpendicular or substantially perpendicular to the acoustic wave propagation direction.

First ends of a plurality of first electrode fingers 13 are connected to the first busbar 11. First ends of a plurality of second electrode fingers 14 are connected to the second busbar 12. The plurality of first electrode fingers 13 and the plurality of second electrode fingers 14 are interdigitated with each other. A region where the first electrode fingers 13 and the second electrode fingers 14 overlap in the acoustic wave propagation direction is an intersecting width region. The dimension of the intersecting width region along a direction in which the first electrode fingers 13 and the second electrode fingers 14 extend is an intersecting width.

The first electrode finger 13 includes a wide portion 13b at the second end thereof. The second electrode finger 14 includes a wide portion 14b at the second end thereof. The second electrode finger 14 includes a wide portion 14c at a position overlapping the wide portion 13b in the acoustic wave propagation direction. The first electrode finger 13 includes a wide portion 13c at a position overlapping the wide portion 14b in the acoustic wave propagation direction.

A region where the wide portion 13c and the wide portion 14b are alternately repeated along the acoustic wave propagation direction is a first edge region E1. A region where the wide portion 13b and the wide portion 14c are alternately repeated along the acoustic wave propagation direction is a second edge region E2. A region between the first edge region E1 and the second edge region E2 is a central region C. That is, the intersecting width region includes the central region C, the first edge region E1, and the second edge region E2. The first edge region E1 and the second edge region E2 are located on the outer side of the central region C in the direction in which the first electrode fingers 13 and the second electrode fingers 14 extend.

In the IDT electrode 3, the first busbar 11 includes a plurality of openings 11a along the acoustic wave propagation direction. An inner busbar portion 11b is provided between the region where the multiple openings 11a are provided and the intersecting width region. An outer busbar portion 11c is provided on the outer side of the openings 11a in an intersecting width direction. The intersecting width direction is parallel or substantially parallel to the direction in which the first electrode fingers 13 and the second electrode fingers 14 extend. The outer busbar portion 11c and the inner busbar portion 11b are coupled by a coupling portion 11d. The coupling portion 11d is located between the adjacent openings 11a. The coupling portion 11d is located on an extension in the direction in which the first electrode fingers 13 and the second electrode fingers 14 extend.

The second busbar 12 also includes a plurality of openings 12a, an inner busbar portion 12b, an outer busbar portion 12c, and a coupling portion 12d like the first busbar 11.

A region where the openings 11a are provided is a first high acoustic velocity region H1, and a region where the openings 12a are provided is a second high acoustic velocity region H2.

The dimensions of the inner busbar portions 11b and 12b and the outer busbar portions 11c and 12c along the direction in which the first electrode fingers 13 and the second electrode fingers 14 extend are defined as widths. The width of the inner busbar portions 11b and 12b is less than that of the outer busbar portions 11c and 12c.

An acoustic velocity in each region in the IDT electrode 3 is schematically illustrated on the right side of FIG. 2A. As represented by arrow V, an acoustic velocity increases toward the right side of the drawing. The relationship of $V1 > V2$ is satisfied where V1 represents an acoustic velocity in the central region C and V2 represents an acoustic velocity in the first edge region E1 and the second edge region E2.

An acoustic velocity in gap regions G1 and G2 located on the outer side of the first edge region E1 and the second edge region E2 is represented by V3, an acoustic velocity in the inner busbar portions 11b and 12b is represented by V4, an acoustic velocity in the first high acoustic velocity region H1 in which the openings 11a are provided and the second high acoustic velocity region H2 in which the openings 12a are provided is represented by V5, and an acoustic velocity in a region where the outer busbar portions 11c and 12c are provided is represented by V6. The relationship of $V2 < V3 < V5$ is satisfied. Accordingly, on the outer side of a low acoustic velocity region including the first edge region E1, the second edge region E2, the gap regions G1 and G2, and the inner busbar portions 11b and 12b, the first high acoustic velocity region H1 and the second high acoustic velocity region H2 are located where an acoustic velocity is V5. Accordingly, the formation of a piston mode can reduce or prevent the occurrence of a transverse-mode ripple.

For the reduction in the acoustic velocity V2, the wide portions 13c and 14b are provided in the first edge region E1 and the wide portions 13b and 14c are provided in the second edge region E2. In addition, in the present preferred embodiment, the thickness of a dielectric film portion 4b on the first edge region E1 and the second edge region E2 is greater than that of a dielectric film portion 4a on the first high acoustic velocity region H1 and the second high acoustic velocity region H2 as illustrated in FIG. 1. That is, the thickness of the dielectric film portion 4b is greater than that of the dielectric film portion 4a. Since the thickness of the dielectric film 4 on the first edge region E1 and the second edge region E2 is greater than that of the dielectric film 4 on the first high acoustic velocity region H1 and the second high acoustic velocity region H2 by ΔH, the acoustic velocity V5 in the first high acoustic velocity region H1 and the second high acoustic velocity region H2 can be further increased as compared with the acoustic velocity V2 in the first edge region E1 and the second edge region E2. That is, the larger the difference ΔH in the film thickness of the dielectric film 4 illustrated in FIG. 1, the larger the difference between the acoustic velocities V5 and V2.

In the acoustic wave device 1, an acoustic velocity difference can be obtained using the above difference ΔH in the film thickness of the dielectric film 4. Accordingly, the difference between the acoustic velocities V2 and V5 can be increased without significantly increasing the width of the wide portions 13b, 13c, 14b, and 14c. Using the difference ΔH in the film thickness of the dielectric film 4, the gap (dimension along the acoustic wave propagation direction) between the first electrode finger 13 and the second electrode finger 14 can be increased to some degree in the first edge region E1 and the second edge region E2. The formation of a piston mode can therefore reduce or prevent the occurrence of a transverse-mode ripple while the occurrence of a surge breakdown is reduced or prevented.

Figure 3:
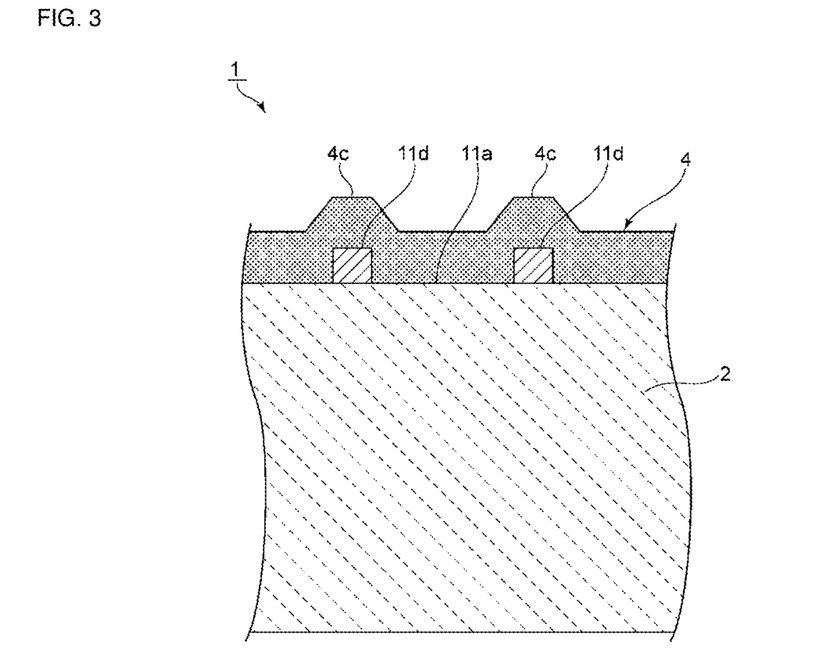
FIG. 3 is an enlarged partially-broken cross-sectional view of an acoustic wave device according to the first preferred embodiment of the present invention in the direction of arrow B in FIG. 1.

FIG. 3 is an enlarged partially-broken cross-sectional view of the acoustic wave device 1 in the first high acoustic velocity region H1 in the direction of arrow B in FIG. 1. This drawing illustrates the cross section of the coupling portion 11d in the direction of the thickness.

In the first high acoustic velocity region H1, the coupling portions 11d are disposed at regular intervals along the acoustic wave propagation direction. On the dielectric film 4, protrusions 4c are provided above the respective coupling portions 11d to cover the coupling portions 11d. The height of the protrusion 4c is located at a position higher than the upper surface of the dielectric film 4 between the protrusions 4c. Since the protrusions 4c are provided at regular intervals along the acoustic wave propagation direction, the position of the upper end of the stop band of an acoustic wave resonator therefore moves to a higher-frequency side. This will be described below using resonance characteristics in FIG. 4.

Figure 4:
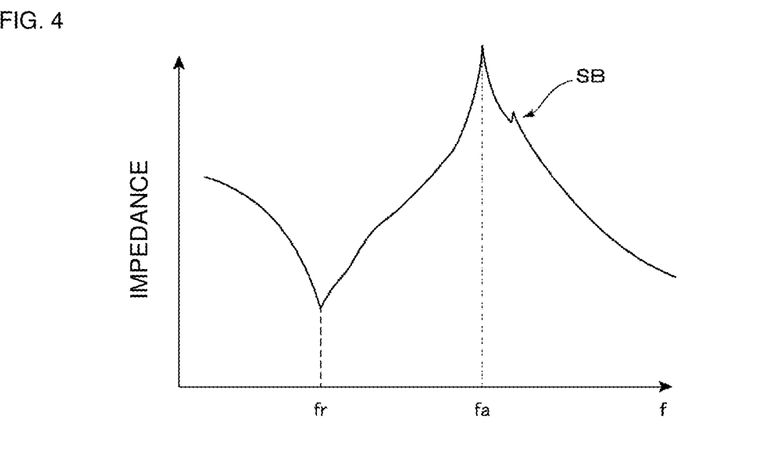
FIG. 4 is a diagram illustrating the impedance characteristics of an acoustic wave device defining and functioning as a resonator.

FIG. 4 is a diagram illustrating the impedance characteristics of an acoustic wave device defining and functioning as a resonator. The lower end of a stop band is located at a resonant frequency fr, and the upper end of the stop band is located at a position higher than an anti-resonant frequency fa. A ripple caused at the upper end of the stop band appears in resonance characteristics. A ripple represented by arrow SB in FIG. 4 is the ripple.

Since the protrusions 4c are provided at regular intervals in the present preferred embodiment, the ripple represented by the arrow SB is shifted from the anti-resonant frequency fa to a position at a distance from the anti-resonant frequency fa, that is, a higher-frequency side. Accordingly, the influence of a ripple caused at the upper end of a stop band upon resonance characteristics or the filter characteristics of an acoustic wave filter including an acoustic wave resonator can be reduced.

Referring to FIG. 1, the dielectric film 4 includes the dielectric film portion 4a whose upper surface is located at a relatively low height and the dielectric film portion 4b whose upper surface is located at a relatively high height. The dielectric film 4 on regions on the outer side of the first high acoustic velocity regions H1 and H2 is equal or substantially equal in film thickness to the dielectric film portion 4a. However, the dielectric film 4 on the outer busbar portions 11c and 12c illustrated in FIG. 2A does not necessarily have to be equal or substantially equal in film thickness to the dielectric film 4 on the first high acoustic velocity region H1 and the second high acoustic velocity region H2. That is, the film thickness of the dielectric film 4 on the outer busbar portions 11c and 12c may be greater than or less than that of the dielectric film portion 4a.

The dielectric film 4 on the central region C does not necessarily have to be equal or substantially equal in thickness to the dielectric film portion 4b of the dielectric film 4 on the first edge region E1 and the second edge region E2. The thickness of the dielectric film 4 on the central region C may be greater than or less than that of the dielectric film portion 4b. It is preferable that the thickness of the dielectric film 4 on the central region C is less than that of the dielectric film portion 4b for the acquisition of an acoustic velocity difference. However, when the upper surface of the dielectric film 4 on the central region C and the upper surface of the dielectric film 4 on the first edge region E1 and the second edge region E2 are flush with each other, that is, when a structure according to the present preferred embodiment is provided, the ease of manufacturing is achieved.

The dielectric film 4 on other regions, that is, the gap regions G1 and G2 where an acoustic velocity is V3 and the region where the inner busbar portions 11b and 12b are provided and an acoustic velocity is V4 does not necessarily have to be equal or substantially equal in thickness to the dielectric film portion 4b as in the present preferred embodiment and may be greater than or less than that of the dielectric film portion 4b.

In the case of a structure according to the present preferred embodiment in which there are the two types of dielectric film portions 4a and 4b, the formation of the dielectric film 4 can be easily performed as described above.

Figure 5:
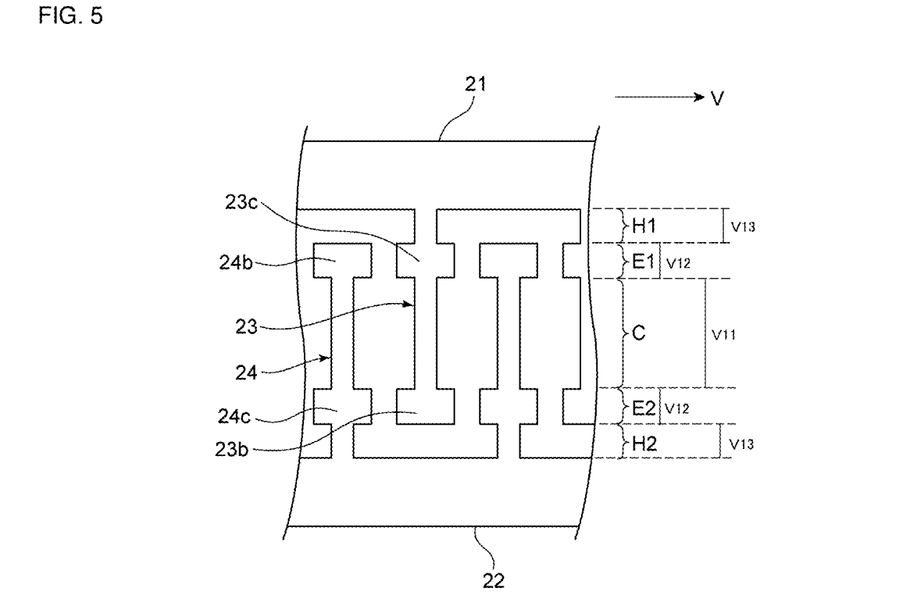
FIG. 5 is an enlarged partially-broken plan view of an IDT electrode in an acoustic wave device according to a second preferred embodiment of the present invention.

FIG. 5 is an enlarged partially-broken plan view of an IDT electrode in an acoustic wave device according to a second preferred embodiment of the present invention. In an acoustic wave device according to the second preferred embodiment, an IDT electrode includes a first busbar 21 including no opening and a second busbar 22 including no opening. First ends of a plurality of first electrode fingers 23 are connected to the first busbar 21. First ends of a plurality of second electrode fingers 24 are connected to the second busbar 22. As in the first preferred embodiment, the first electrode finger 23 includes the central region C and wide portions 23b and 23c. The second electrode finger 24 also includes the central region C and wide portions 24b and 24c. The central region C, the first edge region E1, and the second edge region E2 are therefore provided. In a gap region between the second ends of the first electrode fingers 23 and the second busbar 22, the second high acoustic velocity region H2 is provided. In a gap region between the second ends of the second electrode fingers 24 and the first busbar 21, the first high acoustic velocity region H1 is provided. The relationships of V11>V12 and V12<V13 are satisfied where V11 represents an acoustic velocity in the central region C, V12 represents an acoustic velocity in the first edge region E1 and the second edge region E2, and V13 represents an acoustic velocity in the first high acoustic velocity region H1 and the second high acoustic velocity region H2.

Thus, the structure of an IDT electrode for the use of a piston mode is not limited to the structure according to the first preferred embodiment in which the openings 11*a* and 12*a* are provided. A structure of an IDT electrode according to the second preferred embodiment is the same or substantially the same as that of an IDT electrode according to the first preferred embodiment except for the above point. Accordingly, a dielectric film covers the IDT electrode. The thickness of the dielectric film on the first edge region E1 and the second edge region E2 is greater than that of the dielectric film on the first high acoustic velocity region H1 and the second high acoustic velocity region H2. Accordingly, as in the first preferred embodiment, an acoustic wave device is provided in which a surge breakdown is less likely to occur.

Acoustic wave devices according to preferred embodiments of the present invention are widely applicable to, for example, various bandpass filters.

Figure 6:
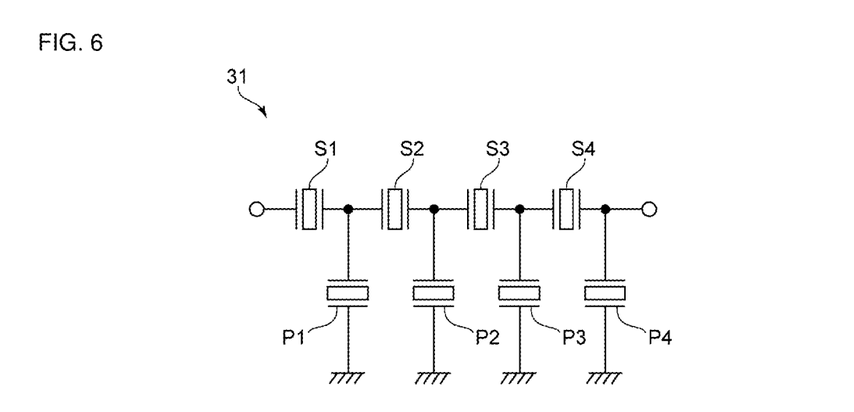
FIG. 6 is a circuit diagram of a ladder filter including an acoustic wave resonator that is an acoustic wave device according to a preferred embodiment of the present invention.

FIG. 6 is a circuit diagram of a ladder filter including an acoustic wave resonator that is an acoustic wave device according to a preferred embodiment of the present invention. A ladder filter 31 includes a plurality of series arm resonator S1 to S4 and a plurality of parallel arm resonators P1 to P4. Each of the series arm resonator S1 to S4 and the parallel arm resonators P1 to P4 is an acoustic wave resonator. An acoustic wave device according to a preferred embodiment of the present invention can be used as at least one of the acoustic wave resonators, so that the occurrence of a transverse-mode ripple can be reduced or prevented and the occurrence of a surge breakdown can be effectively reduced or prevented.

In the acoustic wave device 1 according to the first preferred embodiment, the ripple at the upper end of a stop band can be shifted to a higher-frequency side. Accordingly, when the acoustic wave device is used as each of the parallel arm resonators P1 to P4 in the ladder filter, the influence on the passband can be further reduced.

Figure 7:
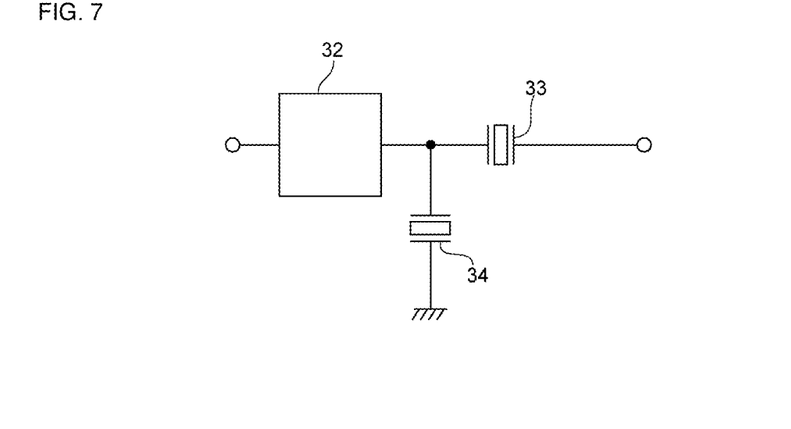
FIG. 7 is a circuit diagram of a bandpass filter in which an acoustic wave device according to a preferred embodiment of the present invention is included.

FIG. 7 is a circuit diagram of a bandpass filter in which an acoustic wave device according to a preferred embodiment of the present invention is provided. An acoustic wave resonator 33 is connected in series with a longitudinally coupled resonator filter 32. An acoustic wave resonator 34 is connected between a series arm and the ground. An acoustic wave device according to a preferred embodiment of the present invention can be used as each of the longitudinally coupled resonator filter 32 and the acoustic wave resonators 33 and 34.

Figure 8:
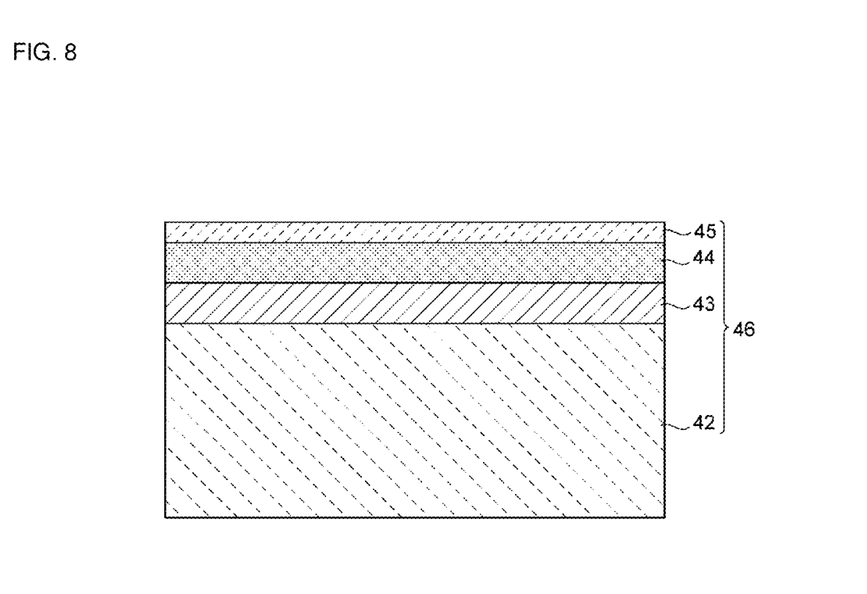
FIG. 8 is an elevational cross-sectional view of a piezoelectric substrate used in an acoustic wave device according to a modification of a preferred embodiment of the present invention.

FIG. 8 is an elevational cross-sectional view of a piezoelectric substrate used in an acoustic wave device according to a modification of a preferred embodiment of the present invention. In an acoustic wave device according to a modification of a preferred embodiment of the present invention, a high-acoustic-velocity material layer 43 and a low-acoustic-velocity material layer 44 are laminated on a support substrate 42. On the low-acoustic-velocity material layer 44, a piezoelectric film 45 is laminated. A piezoelectric substrate 46 having such a laminated structure may be used.

The high-acoustic-velocity material layer 43 is made of a high acoustic velocity material through which a bulk wave propagates at an acoustic velocity higher than the acoustic velocity of a bulk wave that propagates through the piezoelectric film 45. The low-acoustic-velocity material layer 44 is made of a low acoustic velocity material through which a bulk wave propagates at an acoustic velocity lower than the acoustic velocity of a bulk wave that propagates through the piezoelectric film 45.

Examples of the above high acoustic velocity material include aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC (diamond-like carbon) film, diamond, media including the above materials as a principal component, and media including a mixture of the above materials as a principal component. Examples of the above low acoustic velocity material include silicon oxide, glass, silicon oxynitride, tantalum oxide, a compound obtained by adding fluorine, carbon, boron, hydrogen, or silanol group to silicon oxide, and media including the above materials as a principal component.

The support substrate 42 and the high-acoustic-velocity material layer 43 may be integrated to provide a substrate made of a high acoustic velocity material.

In the present invention, the piezoelectric substrate 46 having the above structure may be used. A structure may be used in which an acoustic reflection film including a high acoustic impedance layer and a low acoustic impedance layer is laminated between a piezoelectric film and a substrate, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate;
an IDT electrode on the piezoelectric substrate; and a dielectric film covering the IDT electrode; wherein
the IDT electrode includes a first busbar, a second busbar facing the first busbar, first electrode fingers including respective first ends connected to the first busbar, and second electrode fingers including respective first ends connected to the second busbar;
the first electrode fingers and the second electrode fingers are interdigitated with each other;
when a region where the first electrode fingers and the second electrode fingers overlap in an acoustic wave propagation direction is defined as an intersecting width region, the intersecting width region includes a central region at a center in a direction in which the first electrode fingers and the second electrode fingers extend, a first edge region on one outer side of the central region in the direction in which the first electrode fingers and the second electrode fingers extend, and a second edge region on another outer side of the central region in the direction in which the first electrode fingers and the second electrode fingers extend;
in the first edge region and the second edge region, each of the first electrode fingers and the second electrode fingers has a larger width than a width in the central region;
a first high acoustic velocity region is on an outer side of the first edge region in the direction in which the first electrode fingers and the second electrode fingers extend, and a second high acoustic velocity region is on an outer side of the second edge region in the direction in which the first electrode fingers and the second electrode fingers extend;
a thickness of the dielectric film on the first edge region and the second edge region is greater than a thickness of the dielectric film on the first high acoustic velocity region and the second high acoustic velocity region; and
in a first gap region between the second ends of the second electrode fingers and the first busbar and a second gap region between the first ends of the first electrode fingers and the second busbar, each of the first electrode fingers and the second electrode fingers has a smaller width than the widths in the first and second edge regions;

a total thickness of dielectric material on the first edge region or the second edge region is equal to or substantially equal to a total thickness of dielectric material on the central region;

an upper surface of the dielectric film on the first edge region and the second edge region and an upper surface of the dielectric film on the central region are flush with each other;

each of the first busbar and the second busbar extends in the acoustic wave propagation direction and includes an inner busbar portion connected to the first electrode fingers or the second electrode fingers, an outer busbar portion on an outer side of the inner busbar portion in the direction in which the first electrode fingers and the second electrode fingers extend, and a plurality of openings along the acoustic wave propagation direction in a region between the inner busbar portion and the outer busbar portion;

a portion between the adjacent openings is a coupling portion that couples the inner busbar portion and the outer busbar portion;

the first high acoustic velocity region is a region between the inner busbar portion and the outer busbar portion of the first busbar;

the second high acoustic velocity region is a region between the inner busbar portion and the outer busbar portion of the second busbar; and the total thickness of dielectric material on the first edge region or the second edge region is equal to or substantially equal to a total thickness of dielectric material on the inner busbar portion.

2. A ladder filter comprising:
a plurality of series arm resonators; and
a plurality of parallel arm resonators; wherein
at least one of the plurality of series arm resonators and the plurality of parallel arm resonators is the acoustic wave device according to claim 1.

3. The ladder filter according to claim 2, wherein,
in a cross section of the coupling portion in a direction of thickness, the dielectric film on each of the first high acoustic velocity region and the second high acoustic velocity region includes a protrusion above the coupling portion; and in the first high acoustic velocity region and the second high acoustic velocity region, the protrusions are located along the acoustic wave propagation direction at regular intervals.

4. The ladder filter according to claim 2, wherein the first edge region and the second edge region define a low acoustic velocity region where an acoustic velocity is lower than an acoustic velocity in the central region.

5. The ladder filter according to claim 2, wherein the piezoelectric substrate is a piezoelectric single-crystal substrate.

6. The ladder filter according to claim 2, wherein the piezoelectric substrate is made of $LiNbO_3$ or $LiTaO_3$.

7. The ladder filter according to claim 2, wherein the acoustic wave device is configured as a one-port acoustic wave resonator.

8. The ladder filter according to claim 2, wherein a width of the inner busbar portions is less than a width of the outer busbar portions.

9. The acoustic wave device according to claim 1, wherein,
in a cross section of the coupling portion in a direction of thickness, the dielectric film on each of the first high acoustic velocity region and the second high acoustic velocity region includes a protrusion above the coupling portion; and in the first high acoustic velocity region and the second high acoustic velocity region, the protrusions are located along the acoustic wave propagation direction at regular intervals.

10. The acoustic wave device according to claim 1, wherein the first edge region and the second edge region define a low acoustic velocity region where an acoustic velocity is lower than an acoustic velocity in the central region.

11. The acoustic wave device according to claim 1, wherein the piezoelectric substrate is a piezoelectric single-crystal substrate.

12. The acoustic wave device according to claim 1, wherein the piezoelectric substrate is made of $LiNbO_3$ or $LiTaO_3$.

13. The acoustic wave device according to claim 1, wherein the acoustic wave device is a one-port acoustic wave resonator.

14. The acoustic wave device according to claim 1, wherein a width of the inner busbar portions is less than a width of the outer busbar portions.

* * * * *